United States Patent
Tsukamoto et al.

(10) Patent No.: US 8,410,757 B2
(45) Date of Patent: Apr. 2, 2013

(54) BATTERY STATE MONITORING CIRCUIT AND BATTERY DEVICE

(75) Inventors: Shohei Tsukamoto, Chiba (JP); Atsushi Sakurai, Chiba (JP); Kazuaki Sano, Chiba (JP)

(73) Assignee: Seiko Instruments Inc., Chiba (JP)

( * ) Notice: Subject to any disclaimer, the term of this patent is extended or adjusted under 35 U.S.C. 154(b) by 347 days.

(21) Appl. No.: 12/912,137

(22) Filed: Oct. 26, 2010

(65) Prior Publication Data

US 2011/0101918 A1 May 5, 2011

(30) Foreign Application Priority Data

Oct. 30, 2009 (JP) ................. 2009-250688

(51) Int. Cl.
*H01M 10/46* (2006.01)

(52) U.S. Cl. ....................................... 320/118

(58) Field of Classification Search .......... 320/107, 320/116, 118, 119, 134, 136
See application file for complete search history.

(56) References Cited

U.S. PATENT DOCUMENTS

2004/0189248 A1* 9/2004 Boskovitch et al. .......... 320/116
2006/0103351 A1* 5/2006 Tanigawa et al. ............. 320/118
2008/0180059 A1* 7/2008 Carrier et al. ................. 320/112
2009/0079396 A1* 3/2009 Osamura ....................... 320/134

FOREIGN PATENT DOCUMENTS

JP 08-308115 A 11/1996

* cited by examiner

*Primary Examiner* — Edward Tso
(74) *Attorney, Agent, or Firm* — Brinks Hofer Gilson & Lione

(57) ABSTRACT

Provided are a battery state monitoring circuit capable of detecting disconnection of a battery from a power supply terminal or a ground terminal, and a battery device including the battery state monitoring circuit. The battery state monitoring circuit includes voltage detection circuits provided between the power supply terminal and an intermediate terminal and between the intermediate terminal and another intermediate terminal. For example, if a battery (21) is disconnected from a power supply terminal (11), the power supply terminal (11) is pulled down by a constant current circuit (15) to a voltage of a second intermediate terminal (13) so that a voltage detection circuit (34) detects the disconnection.

4 Claims, 3 Drawing Sheets

US 8,410,757 B2

BATTERY STATE MONITORING CIRCUIT AND BATTERY DEVICE

RELATED APPLICATIONS

This application claims priority under 35 U.S.C. §119 to Japanese Patent Application No. 2009-250688 filed on Oct. 30, 2009, the entire content of which is hereby incorporated by reference.

BACKGROUND OF THE INVENTION

1. Field of the Invention

The present invention relates to a battery state monitoring circuit for monitoring a battery state, and to a battery device.

2. Description of the Related Art

A conventional battery state monitoring circuit and a conventional battery device are described. FIG. 3 illustrates the conventional battery state monitoring circuit and the conventional battery device.

A battery state monitoring circuit 10 monitors each voltage of batteries 21 to 23 inside the battery device. For a case where two or more batteries are connected, constant current circuits 15 and 16 are provided so as to detect the disconnection of the battery from a connection terminal. For example, in the case of disconnection from an intermediate terminal 12, the constant current circuit 16 causes the intermediate terminal 12 to have the same voltage as a ground terminal 14. Accordingly, a voltage difference between a power supply terminal 11 and the intermediate terminal 12 exceeds an overcharge voltage of the battery 21, and hence an overcharge detection circuit 24 detects the overcharge to output a detection signal. Upon receiving the detection signal, a control circuit 20 turns OFF a charge control transistor 27 to stop the charge (see, for example, Japanese Patent No. 3581428).

The technology disclosed in Japanese Patent No. 3581428 is, however, incapable of stopping the charge in the case of disconnection from the power supply terminal 11 or the ground terminal 14. If the battery is disconnected from the power supply terminal 11, the power supply terminal 11 has the same voltage as the intermediate terminal 13 because of the constant current circuit 15. Therefore, the overcharge detection circuit 24 cannot detect the overcharge to stop the charge. If the battery is disconnected from the ground terminal 14, the ground terminal 14 has the same voltage as the intermediate terminal 12 because of the constant current circuit 16. Therefore, the overcharge detection circuit 26 cannot detect the overcharge to stop the charge.

Further, even if the battery is disconnected from the intermediate terminal 12 or 13, unless a total voltage of the batteries 21 to 23 reaches the overcharge voltage, the overcharge detection circuit 24 or 26 cannot detect the overcharge to stop the charge.

SUMMARY OF THE INVENTION

The present invention has been made in view of the above-mentioned problems, and therefore provides a battery state monitoring circuit that is capable of stopping one of charge and discharge or both thereof when a battery is disconnected from any terminal, regardless of battery voltage level, and further provides a battery device including the battery state monitoring circuit.

In order to solve the above-mentioned problems, the present invention provides a battery state monitoring circuit for monitoring each state of a plurality of batteries connected in series, to control charge/discharge of the plurality of batteries, the battery state monitoring circuit including: a plurality of connection terminals provided in correspondence to the plurality of batteries; an overcharge detection circuit provided in correspondence to each of the plurality of batteries, for monitoring a voltage between the connection terminals to which a corresponding one of the plurality of batteries is connected, to detect an overcharge state; a current circuit provided between one of the plurality of connection terminals and another one of the plurality of connection terminals, for causing the one of the plurality of connection terminals to have the same voltage as a voltage of the another one of the plurality of connection terminals when the corresponding one of the plurality of batteries is disconnected from the one of the plurality of connection terminals, the another one of the plurality of connection terminals excludes connection terminals adjacent to the one of the plurality of connection terminals; a voltage detection circuit provided in correspondence to the each of the plurality of batteries, for monitoring the voltage between the connection terminals to which the corresponding one of the plurality of batteries is connected, to detect disconnection of the corresponding one of the plurality of batteries from the connection terminals; and a control circuit for receiving signals of the overcharge detection circuit and the voltage detection circuit to output a signal for controlling the charge/discharge of the plurality of batteries.

According to the present invention, the battery state monitoring circuit includes voltage detection circuits provided between a power supply terminal and an intermediate terminal and between the intermediate terminal and another intermediate terminal. Accordingly, charge control or discharge control may be performed even if the battery is disconnected from the power supply terminal or a ground terminal of the battery state monitoring circuit and also in the case where a total voltage of the batteries is below the overcharge voltage. Therefore, the safety of the battery may be enhanced.

DETAILED DESCRIPTION OF THE PREFERRED EMBODIMENT

Now, referring to the accompanying drawings, an embodiment of the present invention is described below.

Figure 1:
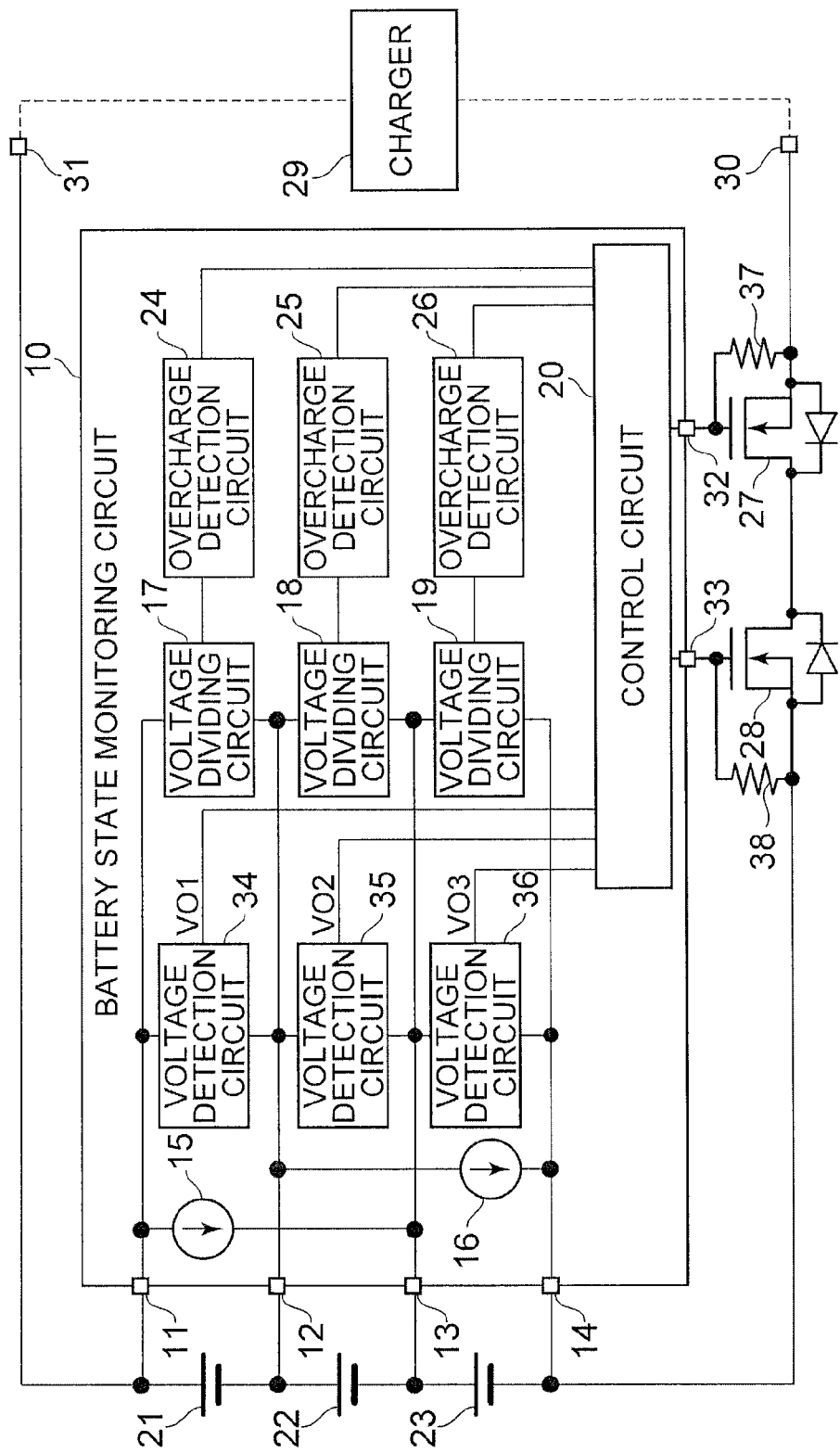
FIG. 1 illustrates a battery state monitoring circuit and a battery device according to the present invention.

First, each configuration of a battery state monitoring circuit and a battery device is described. FIG. 1 illustrates the battery state monitoring circuit and the battery device according to the present invention.

The battery device includes batteries 21 to 23, a battery state monitoring circuit 10, a charge control transistor 27, a discharge control transistor 28, and resistors 37 and 38. The battery state monitoring circuit 10 includes a power supply terminal 11, a first intermediate terminal 12, a second intermediate terminal 13, a ground terminal 14, a first constant current circuit 15, a second constant current circuit 16, voltage detection circuits 34 to 36, voltage dividing circuits 17 to 19, overcharge detection circuits 24 to 26, a control circuit 20, a charge control terminal 32, and a discharge control terminal 33.

The battery 21 is provided between the power supply terminal 11 and the first intermediate terminal 12. The battery 22 is provided between the first intermediate terminal 12 and the second intermediate terminal 13. The battery 23 is provided between the second intermediate terminal 13 and the ground terminal 14. The charge control transistor 27 has a gate connected to the charge control terminal 32, a source and a back gate that are connected to an external ground terminal 30, and a drain connected to a drain of the discharge control transistor 28. The resistor 37 is provided between the gate and the source and back gate of the charge control transistor 27. The discharge control transistor 28 has a gate connected to the discharge control terminal 33, a source and a back gate that are connected to a ground terminal of the battery 23, and the drain connected to the drain of the charge control transistor 27. The resistor 38 is provided between the gate and the source and back gate of the discharge control transistor 28. A charger 29 is connected between an external power supply terminal 31 and the external ground terminal 30.

Figure 2:
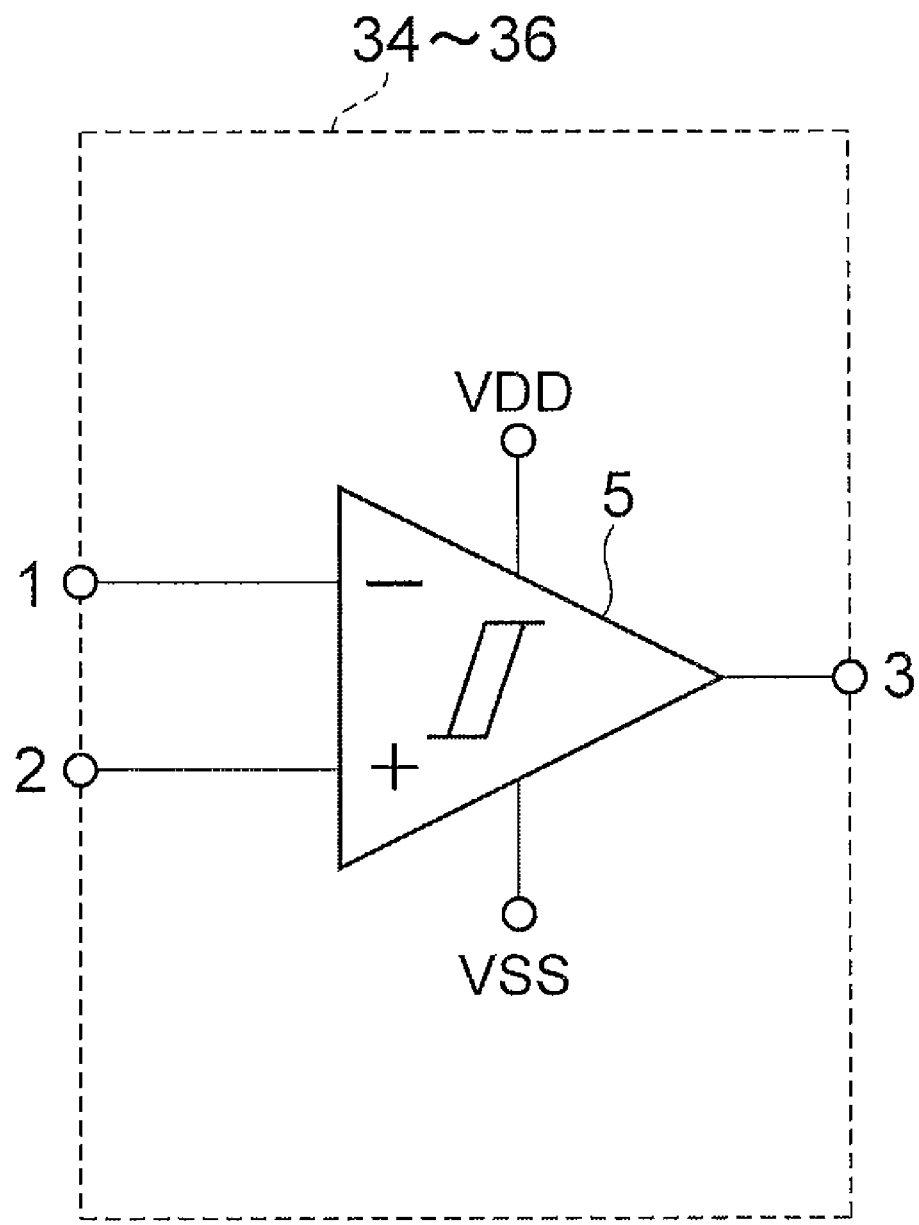
FIG. 2 is a circuit diagram illustrating an exemplary voltage detection circuit.
Figure 3:
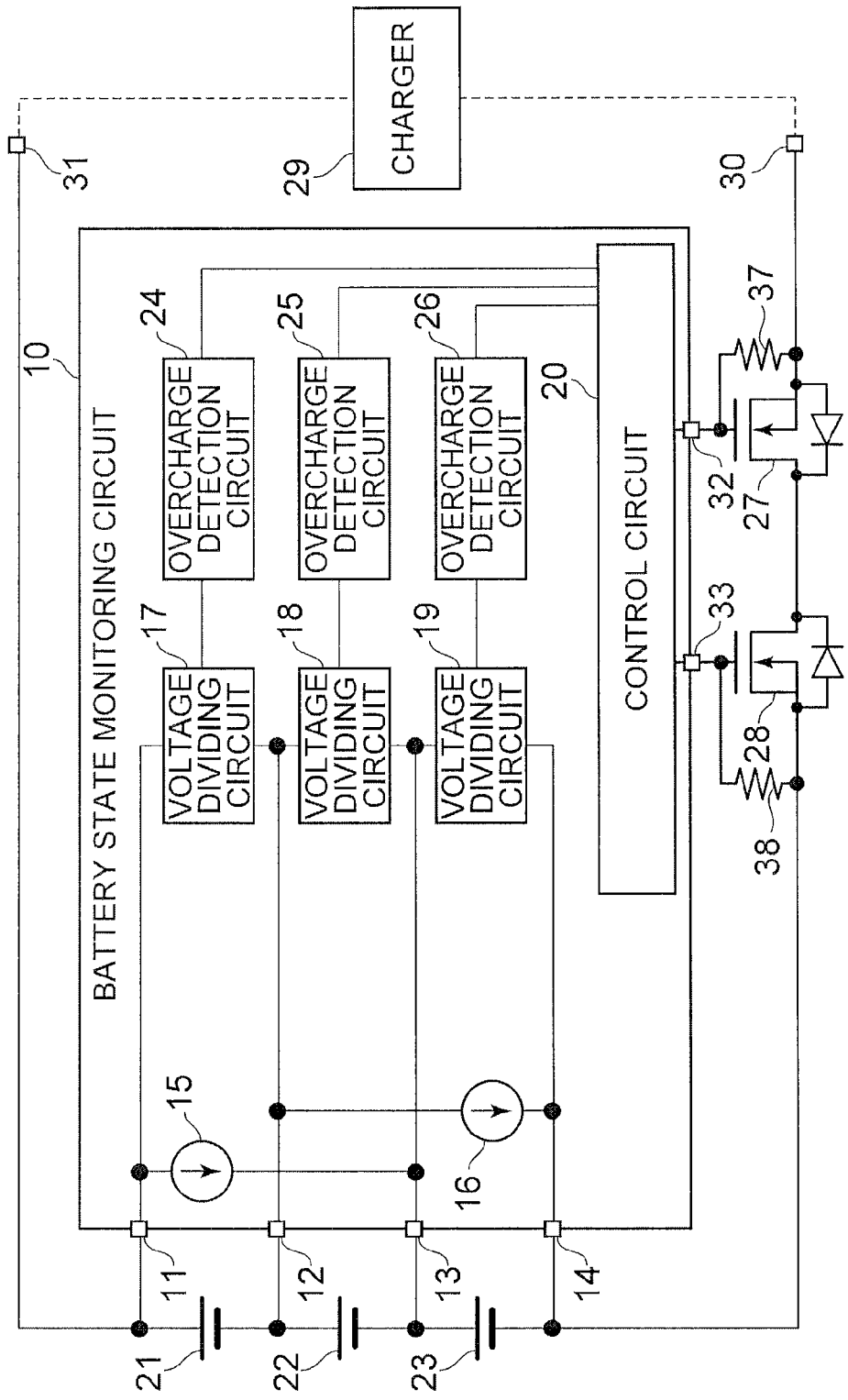
FIG. 3 illustrates a conventional battery state monitoring circuit and a conventional battery device.

Each of the voltage detection circuits 34 to 36 includes, for example, a hysteresis comparator 5 as illustrated in FIG. 2. The hysteresis comparator 5 has a power supply terminal VDD connected to the power supply terminal 11 and a ground terminal VSS connected to the ground terminal 14. The hysteresis comparator 5 of the voltage detection circuit 34 has an inverting input terminal 1 connected to the power supply terminal 11, a non-inverting input terminal 2 connected to the first intermediate terminal 12, and an output terminal 3 connected to a VO1 terminal. The hysteresis comparator 5 of the voltage detection circuit 35 has an inverting input terminal 1 connected to the first intermediate terminal 12, a non-inverting input terminal 2 connected to the second intermediate terminal 13, and an output terminal 3 connected to a VO2 terminal. The hysteresis comparator 5 of the voltage detection circuit 36 has an inverting input terminal 1 connected to the second intermediate terminal 13, a non-inverting input terminal 2 connected to the ground terminal 14, and an output terminal 3 connected to a VO3 terminal.

The charge control transistor 27 controls the charge of the batteries 21 to 23. The discharge control transistor 28 controls the discharge of the batteries 21 to 23. The voltage dividing circuit 17 divides a voltage of the battery 21. The voltage dividing circuit 18 divides a voltage of the battery 22. The voltage dividing circuit 19 divides a voltage of the battery 23. The overcharge detection circuit 24 monitors the voltage output from the voltage dividing circuit 17 to detect an overcharge state of the battery 21. The overcharge detection circuit 25 monitors the voltage output from the voltage dividing circuit 18 to detect an overcharge state of the battery 22. The overcharge detection circuit 26 monitors the voltage output from the voltage dividing circuit 19 to detect an overcharge state of the battery 23. The first constant current circuit 15 pulls down the power supply terminal 11 to a voltage of the second intermediate terminal 13 when the battery is disconnected from the power supply terminal 11, and pulls up the second intermediate terminal 13 to a voltage of the power supply terminal 11 when the battery is disconnected from the second intermediate terminal 13. The second constant current circuit 16 pulls down the first intermediate terminal 12 to a voltage of the ground terminal 14 when the battery is disconnected from the first intermediate terminal 12, and pulls up the ground terminal 14 to a voltage of the first intermediate terminal 12 when the battery is disconnected from the ground terminal 14. The control circuit 20 receives respective detection signals of the overcharge detection circuits 24 to 26, and outputs a signal for turning OFF the charge control transistor 27 to the charge control terminal 32. The control circuit 20 further receives respective detection signals of the voltage detection circuits 34 to 36, and outputs a signal for turning OFF the discharge control transistor 28 to the discharge control terminal 33 as well as outputting the signal for turning OFF the charge control transistor 27 to the charge control terminal 32.

Next, an operation of the battery state monitoring circuit and the battery device is described.

When the charger 29 is connected to the battery device, the batteries 21 to 23 are charged. The overcharge detection circuit 24 monitors the voltage of the battery 21 via the voltage dividing circuit 17. As long as the voltage of the battery 21 is below an overcharge voltage thereof, the overcharge detection circuit 24 outputs a signal for turning ON the charge control transistor 27 to the control circuit 20. Similarly, the overcharge detection circuit 25 monitors the voltage of the battery 22 via the voltage dividing circuit 18, and the overcharge detection circuit 26 monitors the voltage of the battery 23 via the voltage dividing circuit 19. As long as the overcharge detection circuits 24 to 26 detect normal states of the batteries 21 to 23, respectively, the control circuit 20 outputs a voltage of High to the charge control terminal 32 to turn ON the charge control transistor 27. Thus, the charger 29 continues charging the batteries 21 to 23.

Hereinafter, description is given of a detection operation in each case of disconnection between the battery and the connection terminal in the above-mentioned charge state.

If the battery is disconnected from the power supply terminal 11, the power supply terminal 11 is pulled down by the first constant current circuit 15 to the voltage of the second intermediate terminal 13. At this time, the voltage detection circuits 34 to 36, the overcharge detection circuits 24 to 26, and the control circuit 20 included in the battery state monitoring circuit 10 each operate at the voltage of the battery 23. The voltage dividing circuit 17 outputs a divided voltage of the voltage between the power supply terminal 11 and the first intermediate terminal 12, which is lower than the overcharge voltage. The overcharge detection circuit 24 thus outputs no detection signal. On this occasion, in the hysteresis comparator 5 of the voltage detection circuit 34, the inverting input terminal 1 has the same voltage as the second intermediate terminal 13. Accordingly, if the voltage of the second intermediate terminal 13 is lower than the voltage of the first intermediate terminal 12 by a hysteresis voltage, the voltage detection circuit 34 detects the disconnection and outputs a detection signal to the control circuit 20. The control circuit 20 outputs a signal of high impedance to the charge control terminal 32. Because of a pull-down function of the resistor 37, the voltage of the charge control terminal 32 approximates a source voltage and a back gate voltage of the charge control transistor 27, and then falls below a threshold voltage of the charge control transistor 27, with the result that the charge control transistor 27 is turned OFF. Therefore, the charge of the batteries 21 to 23 by the charger 29 is stopped. At this time, it is also possible to turn OFF the discharge control transistor 28 to stop the discharge.

If the battery is disconnected from the first intermediate terminal 12, the first intermediate terminal 12 is pulled down by the second constant current circuit 16 to the voltage of the ground terminal 14. At this time, the voltage detection circuits 34 to 36, the overcharge detection circuits 24 to 26, and the control circuit 20 included in the battery state monitoring circuit 10 each operate at the voltage of the batteries 21 to 23. The voltage dividing circuit 17 outputs the divided voltage of the voltage between the power supply terminal 11 and the first intermediate terminal 12, and if the divided voltage is equal to or higher than the overcharge voltage, the overcharge detection circuit 24 outputs a detection signal, whereas if the divided voltage is lower than the overcharge voltage, the overcharge detection circuit 24 outputs no detection signal. On this occasion, in the hysteresis comparator 5 of the voltage detection circuit 35, the inverting input terminal 1 has the same voltage as the ground terminal 14. Accordingly, if the voltage of the ground terminal 14 is lower than the voltage of the second intermediate terminal 13 by a hysteresis voltage, the voltage detection circuit 35 detects the disconnection and outputs a detection signal to the control circuit 20. The control circuit 20 outputs a signal of high impedance to the charge control terminal 32. The charge of the batteries 21 to 23 by the charger 29 is similarly stopped. At this time, it is also possible to turn OFF the discharge control transistor 28 to stop the discharge.

If the battery is disconnected from the second intermediate terminal 13, the second intermediate terminal 13 is pulled up by the first constant current circuit 15 to the voltage of the power supply terminal 11. At this time, the voltage detection circuits 34 to 36, the overcharge detection circuits 24 to 26, and the control circuit 20 included in the battery state monitoring circuit 10 each operate at the voltage of the batteries 21 to 23. The voltage dividing circuit 19 outputs a divided voltage of the voltage between the second intermediate terminal 13 and the ground terminal 14, and if the divided voltage is equal to or higher than the overcharge voltage, the overcharge detection circuit 26 outputs a detection signal, whereas if the divided voltage is lower than the overcharge voltage, the overcharge detection circuit 26 outputs no detection signal. On this occasion, in the hysteresis comparator 5 of the voltage detection circuit 35, the non-inverting input terminal 2 has the same voltage as the power supply terminal 11. Accordingly, if the voltage of the power supply terminal 11 is higher than the voltage of the first intermediate terminal 12 by a hysteresis voltage, the voltage detection circuit 35 detects the disconnection to output a detection signal to the control circuit 20. The control circuit 20 outputs a signal of high impedance to the charge control terminal 32. The charge of the batteries 21 to 23 by the charger 29 is similarly stopped. At this time, it is also possible to turn OFF the discharge control transistor 28 to stop the discharge.

If the battery is disconnected from the ground terminal 14, the ground terminal 14 is pulled up by the second constant current circuit 16 to the voltage of the first intermediate terminal 12. At this time, the voltage detection circuits 34 to 36, the overcharge detection circuits 24 to 26, and the control circuit 20 included in the battery state monitoring circuit 10 each operate at the voltage of the battery 21. The voltage dividing circuit 19 outputs a divided voltage of the voltage between the second intermediate terminal 13 and the ground terminal 14, which is lower than the overcharge voltage. The overcharge detection circuit 26 thus outputs no detection signal. On this occasion, in the hysteresis comparator 5 of the voltage detection circuit 36, the non-inverting input terminal 2 has the same voltage as the first intermediate terminal 12. Accordingly, if the voltage of the first intermediate terminal 12 is lower than the voltage of the second intermediate terminal 13 by a hysteresis voltage of the hysteresis comparator 5, the voltage detection circuit 36 detects the disconnection to output a detection signal to the control circuit 20. The control circuit 20 outputs a signal of high impedance to the charge control terminal 32. Because of the pull-down function of the resistor 37, the voltage of the charge control terminal 32 approximates the source voltage and the back gate voltage of the charge control transistor 27, and then falls below the threshold voltage of the charge control transistor 27, with the result that the charge control transistor 27 is turned OFF. Therefore, the charge by the charger 29 is stopped. Through the operation described above, the battery state monitoring circuit 10 may turn OFF the charge control transistor 27 while operating at the voltage of the battery 21.

As described above, in the battery state monitoring circuit 10, the voltage detection circuits 34 to 36 are provided between the batteries and the connection terminals, and hence it is possible to stop the charge or discharge even if the battery 21 or the battery 23 is disconnected from the power supply terminal 11 or the ground terminal 14 and also in the case where a total voltage of the batteries 21 to 23 is below the overcharge voltage. Therefore, the safety of the battery may be enhanced.

Note that, this embodiment exemplifies the case of three batteries, but the same effect can be obtained in a battery device provided with at least two batteries.

Further, the first constant current circuit 15 and the second constant current circuit 16 may be a resistor circuit.

What is claimed is:

1. A battery state monitoring circuit for monitoring each state of a plurality of batteries connected in series, to control charge/discharge of the plurality of batteries,
   the battery state monitoring circuit comprising:
   a plurality of connection terminals provided in correspondence to the plurality of batteries;
   an overcharge detection circuit provided in correspondence to each of the plurality of batteries, for monitoring a voltage between the connection terminals to which a corresponding one of the plurality of batteries is connected, to detect an overcharge state;
   a current circuit provided between one of the plurality of connection terminals and another one of the plurality of connection terminals, for causing the one of the plurality of connection terminals to have the same voltage as a voltage of the another one of the plurality of connection terminals when the corresponding one of the plurality of batteries is disconnected from the one of the plurality of connection terminals,
   the another one of the plurality of connection terminals excludes connection terminals adjacent to the one of the plurality of connection terminals;
   a voltage detection circuit provided in correspondence to the each of the plurality of batteries, for monitoring the voltage between the connection terminals to which the corresponding one of the plurality of batteries is connected, to detect disconnection of the corresponding one of the plurality of batteries from the connection terminals; and
   a control circuit for receiving signals of the overcharge detection circuit and the voltage detection circuit to output a signal for controlling the charge/discharge of the plurality of batteries.

2. A battery state monitoring circuit according to claim 1, wherein the current circuit comprises a resistor circuit.

3. A battery device, comprising:
   a plurality of batteries, a charge control transistor, and a discharge control transistor, which are connected in series between an external power supply terminal and an external ground terminal; and
   the battery state monitoring circuit according to claim 1, for monitoring each voltage of the plurality of batteries to control charge/discharge of the plurality of batteries.

4. A battery device, comprising:
   a plurality of batteries, a charge control transistor, and a discharge control transistor, which are connected in series between an external power supply terminal and an external ground terminal; and
   the battery state monitoring circuit according to claim 2, for monitoring each voltage of the plurality of batteries to control charge/discharge of the plurality of batteries.

* * * * *